(12) United States Patent
Kubota

(10) Patent No.: US 7,507,477 B2
(45) Date of Patent: Mar. 24, 2009

(54) CONDUCTIVE MICROPARTICLE, PROCESS FOR PRODUCING THE SAME AND ANISOTROPIC CONDUCTIVE MATERIAL

(75) Inventor: Takashi Kubota, Shiga (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 11/632,148

(22) PCT Filed: Jul. 14, 2005

(86) PCT No.: PCT/JP2005/013091

§ 371 (c)(1),
(2), (4) Date: Mar. 19, 2007

(87) PCT Pub. No.: WO2006/006688

PCT Pub. Date: Jan. 19, 2006

(65) Prior Publication Data

US 2007/0202335 A1    Aug. 30, 2007

(30) Foreign Application Priority Data

Jul. 15, 2004    (JP) .............................. 2004-208913

(51) Int. Cl.
*B32B 5/66* (2006.01)
(52) U.S. Cl. ...................... 428/403; 428/402; 428/404; 428/405; 428/406; 427/212
(58) Field of Classification Search ......... 428/402–406; 427/212
See application file for complete search history.

(56) References Cited

U.S. PATENT DOCUMENTS

2002/0142094 A1    10/2002    Fukushima et al.

FOREIGN PATENT DOCUMENTS

| JP | 5-65659 | | 3/1993 |
| JP | 5-65660 | | 3/1993 |
| JP | 5065660 | * | 3/1993 |
| JP | 2507381 | | 4/1996 |
| JP | 8-311655 | | 11/1996 |
| JP | 2001-152045 | * | 5/2001 |
| JP | 2001-152045 | | 6/2001 |
| JP | 2003-34879 | | 2/2003 |
| JP | 2003034879 | * | 2/2003 |
| JP | 2003-306701 | | 10/2003 |

* cited by examiner

*Primary Examiner*—Leszek Kiliman
(74) *Attorney, Agent, or Firm*—Wenderoth, Lind & Ponack, L.L.P.

(57) ABSTRACT

It is an object of the present invention to provide a conductive fine particle having excellent conductivity, furthermore high adhesiveness with a core particle and little cohesion, a method for producing the conductive fine particle where the plating bath is highly stable and an anisotropic conductive material using the conductive fine particle.

The present invention is a conductive fine particle, wherein an alloy plated coating film containing nickel, copper and phosphorous is formed on a surface of a core particle by an electroless plating method; preferably the conductive fine particle, wherein a content of phosphorous in the alloy plated coating film in a direction of a thickness is lower on a surface side of the alloy plated coating film than on a core particle side; a method for producing the conductive fine particle, wherein a first electroless plating reaction is carried out by adding a plating solution containing a nickel salt, a phosphorous reducing agent and a pH adjustor to an aqueous suspension of the core particles supporting a metal catalyst, and then, a second electroless plating reaction is carried out by adding a plating solution containing the nickel salt, a copper salt, the phosphorous based reducing agent and the pH adjustor.

10 Claims, 1 Drawing Sheet though the conductive fine particles in Patent Document 2 are excellent in conductivity, the flexibility of the metal coating layer is not sufficient and the adhesiveness with the core particles is insufficient, and therefore, there is a problem that they cannot meet the demand for further increase in reliability of electrical connections, together with rapid progress in electronic apparatuses in recent years.

In addition, in accordance with the method for producing nickel plated particles in Patent Document 3, the concentration of phosphorous is lowered, and thus, the reaction rate gradually increases, and therefore, the bath easily decomposes, causing a problem that it is difficult to control the bath. In addition, the content of phosphorous in the surface of the nickel coating film is low, and therefore, the plated coating film has magnetic properties, causing a problem that the particles easily cohere through the reaction in the vicinity of the surface of the nickel coating film.

Furthermore, though the conductivity of the nickel plated particles in Patent Document 3 is increased by reducing the concentration of phosphorous on the surface side of the plated coating film, still the conductivity is inferior to that of pure nickel metal, and no effect of the conductivity completely improved is obtained.

In view of the above described situation, and an object of the present invention is to provide a conductive fine particle having excellent conductivity, high adhesiveness with the core particle, and little cohesiveness, a method for producing the conductive fine particle where plating bath is highly stable and an anisotropic conductive material using the conductive fine particle.

Means For Solving The Object

In order to achieve the above described object, the invention according to claim 1 provides a conductive fine particle, wherein an alloy plated coating film containing nickel, copper and phosphorous is formed on a surface of a core particle by an electroless plating method.

The invention according to claim 2 provides the conductive fine particle according to claim 1, wherein a content of phosphorous in the alloy plated coating film in a direction of a thickness is lower on a surface side of the alloy plated coating film than on a core particle side.

The invention according to claim 3 provides the conductive fine particle according to claim 1 or 2, which contains nickel and phosphorous in a region of not greater than 20% from the core particle side, and contains nickel, copper and phosphorous in a region of not greater than 80% from the surface side of the alloy plated coating film, in the direction of the thickness in the alloy plated coating film.

The invention according to claim 4 provides the conductive fine particle according to claim 1, 2 or 3, which contains 8 to 15 wt % of phosphorous in an alloy plating composition in the region of not greater than 20% from the core particle side, and contains 0.05 to 5 wt % of phosphorous in the alloy plating composition in the region of not greater than 80% from the surface side of the alloy plated coating film, in the direction of the thickness in the alloy plated coating film.

The invention according to claim 5 provides the conductive fine particle according to claim 1, 2, 3 or 4, which contains 0.5 to 90 wt % of copper in the alloy plating composition in the region of not greater than 80% from the surface side of the alloy plated coating film in the direction of the thickness in the alloy plated coating film.

The invention according to claim 6 provides the conductive fine particle according to claim 1, 2, 3, 4 or 5, which contains 85 to 92 wt % of nickel in the alloy plating composition in the region of not greater than 20% from the core particle side, and contains 5 to 99.45 wt % of nickel in the alloy plating composition in the region of not greater than 80% from the surface side of the alloy plated coating film, in the direction of the thickness in the alloy plated coating film.

The invention according to claim 7 provides the conductive fine particle according to claim 1, 2, 3, 4, 5 or 6, wherein a gold coating film is further formed on the surface of the alloy plated coating film.

The invention according to claim 8 provides a method for producing the conductive fine particle according to claim 1, 2, 3, 4, 5, 6 or 7, wherein a first electroless plating reaction is carried out by adding a plating solution containing a nickel salt, a phosphorous reducing agent and a pH adjustor to an aqueous suspension of the core particles supporting a metal catalyst, and then, a second electroless plating reaction is carried out by adding a plating solution containing the nickel salt, a copper salt, the phosphorous based reducing agent and the pH adjustor.

The invention according to claim 9 provides an anisotropic conductive material, which is obtained by dispersing the conductive fine particle according to claim 1, 2, 3, 4, 5, 6 or 7 in a resin binder.

Hereinafter, the present invention is described in detail.

The conductive fine particle of the present invention is provided by forming an alloy plated coating film containing nickel, copper and phosphorous on the surface of the core particle by an electroless plating method.

The alloy plated coating film contains copper, and therefore, excellent conductivity is provided in comparison with plated coating films containing nickel and phosphorous or pure nickel metal.

The method for forming an alloy plated coating film containing nickel, copper and phosphorous in the present invention is not particularly limited, and a method using a nickel salt, a copper salt and a phosphorous based reducing agent when electroless nickel plating is carried out can be cited as an example.

It is preferable in the conductive fine particle of the present invention for the content of phosphorous in the direction of the thickness in the alloy plated coating film to be smaller on the surface side of the alloy plated coating film than on the core particle side.

The content of phosphorous in the direction of the thickness in the alloy plated coating film is relatively large on the core particle side, and therefore, the adhesiveness between the alloy plated coating film and the core particles becomes excellent, and the content of phosphorous is relatively small on the surface side of the alloy plated coating film, and therefore, the conductivity of the alloy plated coating film becomes excellent.

The method for producing the above described conductive fine particle where the content of phosphorous in the direction of the thickness in the alloy plated coating film is smaller on the surface side of the alloy plated coating film than on the core particle side is not particularly limited, and a method for increasing the rate of nickel plating reaction by gradually raising the pH in electroless nickel plating (pH raising method); a method for gradually raising the temperature for plating; a method for gradually increasing the concentration of the reducing agent in the plating solution; and a method using a plating solution containing a nickel salt and a phosphorous based releasing agent in a first reaction of electroless nickel plating and using a plating solution containing a nickel salt and a phosphorous based reducing agent to which a copper salt is added in a second reaction so that generation of phosphorous as a byproduct is suppressed and the content of phosphorous adsorbed in the plated coating film is reduced (method for adding copper salt in second reaction) can be cited as examples. These methods may be used alone, or two or more of the methods may be combined in use.

As the method for producing a conductive fine particle of the present invention, from among the above methods, it is preferable for the above described pH raising method and the above described method for adding a copper salt in a second reaction to be combined for use. As a result, conductive fine particles where the content of phosphorous in the direction of the thickness in the alloy plated coating film is smaller on the surface side of the alloy plated coating film than on the core particle side can be obtained.

It is preferable for the conductive fine particle of the present invention to contain nickel and phosphorous in a region of not greater than 20% from the core particle side and nickel, copper and phosphorous in a region of not greater than 80% from the surface side of the alloy plated coating film in the direction of the thickness in the alloy plated coating film.

Nickel and phosphorous are contained in a region of not greater than 20% from the core particle side and nickel, copper and phosphorous are contained in a region of not greater than 80% from the surface side of the alloy plated coating film in the direction of the thickness in the alloy plated coating film, and therefore, adhesiveness between the alloy plated coating film and the core particles becomes excellent, and the conductivity of the alloy plated coating film becomes excellent, due to the presence of copper in a region of not greater than 80% from the surface side of the alloy plated coating film in the conductive fine particles.

In the following, a preferred embodiment of the conductive fine particle of the present invention is described in reference to the drawing. As shown in FIG. 1, an alloy plated coating film 3 is formed on the surface of a core particle 2 by an electroless plating method in a conductive fine particle 1 of the present invention, where a region a which is not greater than 20% on the core particle 2 side contains nickel and phosphorous and a region b which is not greater than 80% on the surface 4 side of the alloy plated coating film contains nickel, copper and phosphorous. In addition, it is preferable for the content of phosphorous in the region b to be smaller than the content of phosphorous in the region a.

The above described conductive fine particles can be obtained using the above described method for adding a copper salt in the second reaction and adjusting the time when the first reaction transitions to the second reaction.

When the method for adding a copper salt in the second reaction is used, the rate of deposition of the metal is slow while generation of phosphorous as a byproduct is fast, and therefore, a large amount of phosphorous is taken into the alloy plated coating film, so that an alloy plated coating film having a high content of phosphorous is formed in a case where the rate of reaction is made slow by, for example, controlling the pH in the alloy plating solution in the first reaction. Particles wherein such an alloy plated coating film is formed have a high content of phosphorous, making the alloy plated coating film nonmagnetic, and thus, the cohesiveness of the particles becomes low, and in addition, a uniform and fine alloy plated coating film with no concavity and convexity can be formed, so that the adhesiveness with the core particles becomes excellent.

In addition, particles easily cohere, particularly in the first reaction, and therefore, the content of phosphorous in the alloy plated coating film can be made high in the first reaction, in order to reduce cohesion.

It is preferable for the conductive fine particle of the present invention to contain 8 to 15 wt % of phosphorous in an alloy plating composition in the region of not greater than 20% from the core particle side, and contain 0.05 to 5 wt % of phosphorous in the alloy plating composition in the region of not greater than 80% from the surface side of the alloy plated coating film, in the direction of the thickness in the alloy plated coating film.

In a case where the content of phosphorous is 8 to 15 wt % in the alloy plating composition in a region of not greater than 20% from the core particle side in the direction of the thickness in the alloy plated coating film, the alloy plated coating film has little cohesiveness and high adhesiveness with the core particles. In addition, in a case where the content of phosphorous is 0.05 to 5 wt % in the alloy plating composition in a region of not greater than 80% from the surface side of the alloy plated coating film, the conductivity of the alloy plated coating film becomes excellent.

In addition, it is preferable for the conductive fine particle of the present invention to contain 0.5 to 90 wt % of copper in the alloy plating composition in the region of not greater than 80% from the surface side of the alloy plated coating film in the direction of the thickness in the alloy plated coating film.

In a case where the content of copper is 0.5 to 90 wt % in the alloy plating composition in a region of not greater than 80% from the surface side of the alloy plated coating film in the direction of the thickness in the alloy plated coating film, the conductivity of the alloy plated coating film becomes excellent.

Furthermore, it is preferable for the conductive fine particle of the present invention to contain 85 to 92 wt % of nickel in the alloy plating composition in the region of not greater than 20% from the core particle side, and contain 5 to 99.45 wt % of nickel in the alloy plating composition in the region of not greater than 80% from the surface side of the alloy plated coating film, in the direction of the thickness in the alloy plated coating film.

The ratio of content of respective metals, phosphorous and the like in the alloy plated coating film in the present invention can be found using, for example, an EDX (Energy Dispersing X-ray analyzer).

Next, another preferred embodiment of the conductive fine particle of the present invention is described in reference to the drawing. As shown in FIG. 2, an alloy plated coating film 13 is formed on the surface of a core particle 12 in accordance with an electroless plating method in a conductive fine particle 11 of the present invention, where a region A of not greater than 20% on the core particle 12 side contains nickel and phosphorous, and a region C of not greater than 20% on the surface 14 side of the alloy plated coating film and a region B, which is sandwiched between the regions A and C, contain nickel, copper and phosphorous. In addition, it is preferable for the content of phosphorous in the region B to be smaller than the content of phosphorous in the region A, and for the content of phosphorous in the region C to be smaller than the content of phosphorous in the region B.

It is preferable in the conductive fine particle of the present invention for the ratios of the numbers of atoms of phosphorous (P) or copper (Cu) to that of nickel (Ni) contained in the alloy plated coating film, which are found using the above described EDX, of P/Ni and Cu/Ni to be 0.05<P/Ni<0.5 in the region A, 0.05<P/Ni<0.5 and 0<Cu/Ni<0.05 in the region B, and 0.03<P/Ni<0.5 and 0.05<Cu/Ni<8 in the region C. Furthermore, it is preferable for the P/Ni in the region B to be smaller than that in the region A, and for the P/Ni in the region C to be smaller than that in the region B and for the Cu/Ni in the region C to be greater than that in the region B.

As a result, the effects of increasing the conductivity of the conductive fine particle of the present invention by reducing the content of phosphorous near the surface are obtained, and in addition, the conductivity is significantly increased as a result of plating, which contains copper, in comparison with conventional nickel-phosphorous coating films, and furthermore, cohesion of the conductive fine particles can be prevented and the adhesiveness with the core particles can be increased.

It is preferable in the conductive fine particle of the present invention, wherein a gold coating film is further formed on the surface of the alloy plated coating film.

As the method for forming a gold coating film, an electroless gold plating method, such as a substitution gold plating method and a reduced gold plating method, an electrolytic gold plating method and a sputtering method, can be cited as examples. From among these, the electroless gold plating method is preferable.

In a case where, for example, substitution gold plating is carried out as described above as the electroless gold plating, the higher the purity of nickel, for example, is in the alloy plated coating film, the easier the substitution reaction progresses, and in the conductive fine particle of the present invention, the content of phosphorous on the surface side of the alloy plated coating film is very low, and therefore, a dense gold coating film can be formed.

As the producing method for obtaining the conductive fine particle of the present invention, the above described method for adding a copper salt in the second reaction is preferable, and concretely, a method, wherein a first electroless plating reaction is carried out by adding a plating solution containing a nickel salt, a phosphorous reducing agent and a pH adjustor to an aqueous suspension of the core particles supporting a metal catalyst, and then, a second electroless plating reaction is carried out by adding a plating solution containing the nickel salt, a copper salt, the phosphorous based reducing agent and the pH adjustor, is preferable.

A method for producing the conductive fine particle of the present invention, wherein a first electroless plating reaction is carried out by adding a plating solution containing a nickel salt, a phosphorous reducing agent and a pH adjustor to an aqueous suspension of the core particles supporting a metal catalyst, and then, a second electroless plating reaction is carried out by adding a plating solution containing the nickel salt, a copper salt, the phosphorous based reducing agent and the pH adjustor, also constitutes the present invention.

Furthermore, the method for producing the conductive fine particle of the present invention is described in the following.

In accordance with the method for producing the conductive fine particle of the present invention, a plating solution containing a nickel salt, a phosphorous based reducing agent and a pH adjustor is added to an aqueous suspension of the core particle supporting a metal catalyst in the first reaction, and thereby, the plating bath becomes highly stable.

In accordance with a concrete method for producing the conductive fine particle of the present invention, a catalyst of a noble metal, such as palladium, is supported on the surface of the core particle, and the core particle supporting palladium are put into an aqueous solution, providing an aqueous suspension into which a plating solution containing a nickel salt, a phosphorous based reducing agent and a pH adjustor is dropped so that the first reaction is completed, and after that, a plating solution containing a nickel salt, a copper salt, a phosphorous based reducing agent and a pH adjustor is dropped so that the second reaction is completed. As a result, conductive fine particles which are plated in an electroless manner can be obtained.

In order to obtain core particles which support a catalyst of a noble metal, such as palladium in accordance with the above described producing method, it is preferable to prepare core particles which can capture noble metal ions, such as palladium ions, on the surface as a chelate or a salt, that is to say, core particles having a function of capturing noble metal ions, and to make the core particles capture noble metal ions, and then, to apply a reducing agent so that the surface of the core particles supports a noble metal catalyst.

As the core particles which can capture noble metal ions, such as palladium ions, on the surface as a chelate or a salt, core particles having a functional group, such as an amino group or an imino group, on the surface are preferable, and particularly, core particles having a functional group of an amino group are more preferable.

In addition, a surface process using a cation based surfactant, for example, is carried out on core particles which do not have a functional group as described above, and thereby, core particles which can capture noble metal ions, such as palladium ions, on the surface can be obtained.

The form of the core particles which support a noble metal catalyst on the surface is not particularly limited as long as the particles can be suspended in water in accordance with a conventional dispersing method, and particles in specific form, such as spherical form, fiber form, hollow form and needle form, for example, may be used, or particles in unfixed form may be used. From among these, it is preferable for the core particles to be in spherical form in order to obtain excellent electrical connections.

Though the particle diameter of the above described core particles is not particularly limited, a range from 1 to 100 μm is preferable, and a range from 2 to 20 μm is more preferable.

Though the material of the above described core particles may be an organic material or an inorganic material, and is not particularly limited as long as it has an appropriate modulus of elasticity, properties of elastically changing the form and properties of restoring the form, it is preferable for it to be an organic material such as that of resin particles.

The above described organic material is not particularly limited, and phenol resins, amino resins, polyester resins, urea resins, melamine resins, epoxy resins, divinylbenzene polymers; divinylbenzene based polymers such as, divinylbenzene-styrene copolymers, divinylbenzene-(meth)acrylate copolymers; and (meth)acrylate polymers can be cited as examples. As for the above described (meth)acrylate polymers, either a cross linking type or a non cross linking type may be used if necessary, and these may be mixed for use. From among these, divinylbenzene based polymers and (meth)acrylate based polymers are preferably used. Here, (meth)acrylates mean methacrylates or acrylates.

As for the above described inorganic material, metals, glass, ceramics, metal oxides, metal silicates, metal carbides, metal nitrides, metal carbonates, metal sulfates, metal phosphates, metal sulfides, metal acidic salts, metal halides and carbon can be cited as examples.

These core particles may be used solely or two or more types may be used together.

As the method for making the above described core particles capture noble metal ions, a method for dispersing the core particles in a diluted acidic solution of a noble metal salt and making the core particles capture noble metal ions can be cited as an example.

In accordance with the above described method, it is preferable for the concentration to be 0.001 to 0.8 wt % in a case where palladium chloride is used as the noble metal salt in the acidic solution, and it is preferable for the concentration to be 0.005 to 0.2 wt % in a case where palladium sulfate is used.

In addition, in order to convert the noble metal ions captured by the core particles to a noble metal catalyst, it is preferable for a phosphorous based or boron based reducing agent, which is used for nickel plating, to be used in the acidic solution after the noble metal ions have been captured so that the noble metal ions are reduced to become a noble metal catalyst.

In accordance with the method for producing the conductive fine particle of the present invention, it is preferable for the concentration of the core particles in the aqueous suspension to be 0.5 to 1.5 wt % in order to prevent cohesion from occurring in the aqueous suspension when the aqueous suspension of core particles supporting a noble metal catalyst is prepared.

Furthermore, it is preferable to add ammonium, sodium hydroxide, sulfuric acid or hydrochloric acid, for example, to the above described aqueous suspension in order to adjust the pH of the reactive solution at the time when the plating reaction begins.

As the phosphorous based reducing agent in accordance with the method for producing the conductive fine particle of the present invention, sodium hypophosphite, calcium hypophosphite and hypophosphorous acid can be cited as examples.

It is preferable for the concentration of the above described phosphorous based reducing agent to be 3 to 30 wt %.

In accordance with the method for producing the conductive fine particle of the present invention, it is preferable for the plating solution to contain a complexing agent.

The above described complexing agent is not particularly limited as long as it is a compound have complexing effects on metal ions, and carboxylic acids, such as malic acid, lactic acid, tartaric acid, citric acid, gluconic acid and hydroxyacetic acid or carboxylates of these, such as alkali metal salts and ammonium salts, amino acids, such as glycine, amines, such as ethylene diamine and alkyl amine, ammonium, EDTA and pyrophosphate can be cited as examples.

It is preferable for the concentration of the above described complexing agent to be 0.1 to 8 wt %.

In accordance with the method for producing the conductive fine particle of the present invention, a plating solution to be used in the first reaction and a plating solution to be used in the second reaction are prepared.

In the above described first reaction, that is to say, in forming a plated coating film on the core particle side having a large content of phosphorous, it is preferable for the plating solution to be one type of a solution containing, for example, a nickel salt solution, such as nickel sulfate or nickel chloride, a phosphorous based reducing agent, such as sodium hypophosphite, a pH adjustor and a complexing agent.

In the above described second reaction, it is preferable for the plating solution to be prepared as two types of solutions, with solution 1 containing, for example, a nickel salt solution, such as nickel sulfate or nickel chloride, a copper salt solution, such as copper sulfate or chopper chloride, a complexing agent and a stabilizer, and solution 2 containing a phosphorous based reducing agent, such as sodium hypophosphite, and a pH adjustor.

It is preferable for the above described solution 1 and the above described solution 2 to be mixed before being used in the second reaction, and then used as a plating solution for the second reaction.

In the above described second reaction, the concentration of the nickel salt in the plating solution for the second reaction is set corresponding to the film thickness of the plated coating film, and in a case where, for example, a plated coating film having a film thickness of 0.01 to 0.05 μm is formed on core particles having a specific area of 1.3 $m^2/g$ and a particle diameter of 4 μm, it is preferable for the concentration to be 5 to 25 wt %. In addition, it is preferable for the concentration of the copper salt to be in a range from ½ to 5 times the concentration of the added nickel salt.

Furthermore, it is preferable for the concentration of the reducing agent in the plating solution for the second reaction to be 3 to 30 wt %.

In the present invention, adjusting the time when the above described first reaction transitions to the above described second reaction, conductive fine particles can be obtained so as to contain nickel and phosphorous in a region of not greater than 20% from the core particle side and containing nickel, copper and phosphorous in a region of not greater than 80% from the surface side of the alloy plated coating film in the direction of the thickness in the alloy plated coating film.

As the method for producing conductive fine particles, of which the content of phosphorous is smaller in a region of not greater than 80% from the surface side of the alloy plated coating film in the direction of the thickness in the alloy plated coating film in the second reaction, a method for increasing the rate of reaction of nickel plating by gradually raising the pH in electroless plating, a method for gradually raising the temperature for plating and a method for gradually increasing the concentration of the reducing agent in the plating solution can be cited as examples. These methods may be used solely or two or more methods may be combined for used. From among these, the method for gradually raising the pH is preferable in reducing the content of phosphorous. In a case where the content of phosphorous is made low on the surface side of the alloy plated coating film in the above described manner, the content of copper can be made high on the surface side of the alloy plated coating film.

In addition, it is preferable to lower the temperature for plating as much as possible in the second reaction in order to suppress the cohesion of particles and to stabilize the plating bath. Concretely, it is preferable for the temperature of the plating bath, to which a plating solution has been added, to be set at 20 to 40° C.

In order to do this, it is preferable to lower the temperature for plating as much as possible in the first reaction, and thereby, it becomes easy to adjust the temperature in the second reaction, making it easy to increase the work efficiency.

Here, in a case where an alloy plated coating film containing nickel and copper, of which the concentration of phosphorous is low, is formed on the surface, it may be easy for the particles to suddenly cohere during plating, and therefore, it is preferable to complete the alloy plating reaction before the particles cohere after it has been perceived that hydrogen has not been generated accompanying the alloy plating reaction.

After the completion of the alloy plating reaction, maturing is carried out while continuing stirring for approximately 10 minutes to 20 minutes, and after that, the particles are separated through filtering, washed with alcohol, warm water and the like and dried, and thus, conductive fine-particles can be obtained.

An anisotropic conductive material of the present invention is obtained by dispersing the above-described conductive fine particle of the present invention in a resin binder.

The above described anisotropic conductive material is not particularly limited as long as the conductive fine particle of the present invention is dispersed in a resin binder, and anisotropic conductive pastes, anisotropic conductive inks, anisotropic conductive adhesives, anisotropic conductive films and anisotropic conductive sheets can be cited as examples.

The method for producing the anisotropic conductive material of the present invention is not particularly limited, and a method for obtaining, for example, an anisotropic conductive paste, an anisotropic ink or an anisotropic conductive adhesive by adding and uniformly mixing the conductive fine particle of the present invention into an insulating resin binder so that the conductive fine particles are uniformly dispersed and a method for obtaining, for example, an anisotropic conductive film or an anisotropic conductive sheet wherein the conductive fine particle of the present invention is added and uniformly mixed into an insulating resin binder so that a uniform conductive composition is produced, and after that, this conductive composition is dissolved (dispersed) uniformly in an organic solvent, if necessary, or heated to be melted in order to be applied to the mold release processed surface of a mold release material, such as mold release paper or a mold release film so as to have a predetermined film thickness, followed by drying or cooling, if necessary, can be cited as examples, and thus, an appropriate producing method may be selected corresponding to the type of the anisotropic conductive material which is desired to be produced. In addition, an insulating resin binder and the conductive fine particle of the present invention may be separately used without being mixed together, and thereby, an anisotropic conductive material may be provided.

The resin of the above described insulating resin binder is not particularly limited, and vinyl based resins, such as vinyl acetate based resins, vinyl chloride based resins, acryl based resins and styrene based resins; thermoplastic resins, such as polyolefin based resins, ethylene-vinyl acetate copolymers and polyamide based resins; curing resins, such as those made of an epoxy based resin, an urethane based resin, a polyimide based resin or an unsaturated polyester based resin and a curing agent of these; thermoplastic block copolymers, such as styrene-butadiene-styrene block copolymers, styrene-isoprene-styrene block copolymers and hydrogenated compounds thereof; and elastomers (rubbers) such as styrene-butadiene copolymer rubbers, chloroprene rubbers and acrylonitrile-styrene block copolymer rubbers can be cited as examples. These resins may be used solely or two or more types may be used together. In addition, the above-described curing resins may be of any curing form from among a room temperature curing type, a thermosetting type, a light curing type and a moisture curing type.

In the anisotropic conductive material of the present invention, one or more types from among a variety of additives, such as a bulking filler, a softening agent (plasticizer), a thickening agent, an antioxidant (age inhibitor), a heat stabilizer, a light stabilizer, an ultraviolet ray absorber, a coloring agent, an flame retardant and an organic solvent, may be added to the insulating resin binder and the conductive fine particle of the present invention, if necessary, in a range that the object of the present invention is not prevented from being achieved.

(Operation)

In the conductive fine particle of the present invention, for example, the pH of the alloy plating solution is controlled so that the pH is lowered in the first reaction, and thereby, the rate of reaction becomes slow, and thus, the rate of deposition of the metal is slow on the core particle side, and phosphorous, which is a byproduct, is generated quickly, and therefore, a large amount of phosphorous is taken in the alloy plated coating film, and an alloy plated coating film having a high content of phosphorous is formed. The particles wherein such an alloy plated coating film is formed have a high content of phosphorous, and therefore, the degree of cohesion of the particles can be reduced by making the alloy plated coating film nonmagnetic, and in addition, a uniform and dense alloy plated coating film without concavity and convexity can be formed, making adhesiveness with the core particles high.

In addition, after the first reaction progresses to the second reaction, phosphorous, which is a byproduct, is prevented from being generated, and instead, copper is deposited due to the use of a copper salt in the second reaction, and therefore, the amount of phosphorous which is deposited in the alloy plated coating film becomes low. Furthermore, the pH of the alloy plating solution is gradually raised, for example, and thereby, the content of phosphorous becomes low on the surface side of the alloy plated coating film and the content of copper becomes high on the surface side of the alloy plated coating film.

Accordingly, the obtained conductive fine particles contain copper, which has high conductivity in the alloy plated coating film, and therefore, have a high conductivity, and furthermore, the content of phosphorous, which is a substance that inhibits conductivity, is low and the content of copper is high on the surface side of the alloy plated coating film, and therefore, the obtained conductive fine particles have excellent conductivity.

Furthermore, the concentration of phosphorous is very low on the surface side of the alloy plated coating film, and therefore, when gold plating is carried out, a substitution reaction with gold is accelerated so that dense plating with substituted gold can be easily achieved, thus providing excellent conductive fine particles.

The conductive fine particle of the present invention has excellent adhesiveness between the core particles and the plating, and therefore, when they are dispersed in a resin binder and the mixture is kneaded to produce an anisotropic conductive material, it is difficult for the plated coating film to come off. In addition, the alloy plated coating film contains copper, which has good conductivity, and therefore, the anisotropic conductive material of the present invention, using the conductive fine particle of the present invention, has excellent conductivity.

Effects Of The Invention

The conductive fine particle of the present invention has a configuration as described above, and therefore, has excellent conductivity, and furthermore, it becomes possible to obtain conductive fine particles which have high adhesiveness with the core particles and little cohesion. In addition, the method for producing the conductive fine particle of the present invention makes it possible to obtain a producing method for conductive fine particles where the plating bath is highly stable, and the conductive fine particles have excellent conductivity, high adhesiveness with the core particles and little cohesion. Furthermore, the anisotropic conductive material, using the conductive fine particle of the present invention, has excellent conductivity.

BEST MODE FOR CARRYING OUT THE INVENTION

In the following, the present invention is described in further detail by citing examples. Here, the present invention is not limited to the following examples.

EXAMPLE 1

Divinylbenzene based polymer resin particles having a particle diameter of 4 μm ("SP-204", made by Sekisui Chemical Co., Ltd.) were processed in a solution of 10 wt % of an ion adsorbent for 5 minutes, and after that, processed in a solution of 0.01 wt % of palladium sulfate for 5 minutes, and furthermore, a reducing process was carried out by adding dimethyl amine borane, and then, the particles were separated through filtering and washed, and thereby, core particles supporting palladium were obtained.

Next, 500 ml of ion exchanged water containing 1 wt % of sodium succinate was prepared and mixed with 10 g of the obtained core particles so that an aqueous suspension was prepared, and furthermore, sulfuric acid was added and an aqueous suspension, of which the pH was 5, was prepared.

Meanwhile, an alloy plating solution containing 20 wt % of nickel sulfate, 20 wt % of sodium hypophosphite and 8 wt % of sodium hydroxide was prepared.

The obtained aqueous suspension was heated to 80° C., into which the obtained alloy plating solution for the first reaction was then dropped continuously, and stirred for 20 minutes, and thereby, the first electroless plating reaction occurred. During this plating reaction, there was no significant cohesion, and when it was confirmed that the generation of hydrogen had ended, the first reaction was completed.

Next, an alloy plating solution containing 10 wt % of nickel sulfate, 10 wt % of copper sulfate, 5 wt % of sodium hypophosphite and 5 wt % of sodium hydroxide was prepared as an alloy plating solution for the second reaction.

After that, the obtained alloy plating solution for the second reaction was continuously dropped into the solution after the completion of the first reaction, and the solution was stirred for 1 hour, and thereby, a second electroless plating reaction occurred so that conductive fine particles wherein an alloy plated coating film was formed were obtained (conductive fine particles 1).

Furthermore, substitution gold plating was carried out on the obtained conductive fine particles wherein an alloy-plated coating film was formed, and conductive fine particles wherein a gold coating film was formed on the alloy plated coating film were obtained (conductive fine particles 2).

(Evaluation of Conductive Fine Particles)

Concerning the obtained conductive fine particles 1 and conductive fine particles 2, a particle was cut using a focused ion beam so as to obtain a cross section which was then observed with a transmission electron microscope having a magnification of 200,000, and the state of the plated coating film and the film thickness were examined. A uniform and fine alloy plated coating film was densely deposited on these conductive fine particles.

In addition, concerning the conductive fine particles 1 and the conductive fine particles 2, the conductivity (resistance value) was examined in accordance with the following method for measuring a resistance value of conductive fine particles.

Furthermore, concerning the conductive fine particles 2, the contents of nickel, copper and phosphorous in the alloy plated coating film were examined in accordance with the following method for measuring component using an EDX.

The results are shown in Table 1.

(Method for Measuring Resistance Value of Conductive Fine Particles)

A micro compression testing machine ("DUH-200", made by Shimadzu Corporation) was adjusted for use so that a resistance value could be measured, and the resistance was measured while compressing a conductive fine particle, and thereby, the resistance value of the conductive fine particle was measured.

(Method for Measuring Component Using EDX)

A conductive fine particle was cut with a focused ion beam using an EDX ("energy dispersive X-ray analyzer", made by JEOL Datum Ltd.) so as to obtain a cross section, and component analysis was carried out on each portion in the alloy plated coating film, and thereby, the detected values of nickel, copper and phosphorous were measured. The contents of nickel, copper and phosphorous in the alloy plating composition were calculated from the obtained measurement values.

EXAMPLE 2

Conductive fine particles 1 and conductive fine particles 2 were obtained in the same manner as in Example 1, except that an alloy plating solution containing 10 wt % of nickel sulfate, 10 wt % of copper sulfate, 5 wt % of sodium hypophosphite and 5 wt % of sodium hydroxide was not used as the alloy plating solution for the second reaction, and instead, an alloy plating solution containing 20 wt % of nickel sulfate, 5 wt % of sodium hypophosphite and 5 wt % of sodium hydroxide was used.

The conductive fine particles were evaluated in the same manner as in Example 1. The results are shown in Table 1. A uniform and fine alloy plated coating film was densely deposited on these conductive fine particles.

TABLE 1

|  |  |  |  | Example 1 | Example 2 | Example 3 | Comparative Example 1 |
|---|---|---|---|---|---|---|---|
| Conductive fine particle wherein alloy plated coating film is formed | alloy plated coating film | film thickness (µm) | | 0.082 | 0.085 | 0.081 | 0.082 |
| | | resistance value (Ω) | | 2.0 | 1.2 | 3.5 | 7.0 |
| Conductive fine particle wherein gold coating film is formed on alloy plated coating film | alloy plated coating film | region a | Ni content (wt %) | 88 | 88 | 88 | 88 |
| | | | P content (wt %) | 12 | 12 | 12 | 12 |
| | | region b | Ni content (wt %) | 43 | 22 | 73 | 91 |
| | | | Cu content (wt %) | 50 | 73 | 18 | 0 |
| | | | P content (wt %) | 7 | 5 | 9 | 9 |
| | | film thickness (µm) | | 0.060 | 0.062 | 0.059 | 0.060 |
| | gold plated coating film | film thickness (µm) | | 0.012 | 0.012 | 0.012 | 0.011 |
| | | resistance value (Ω) | | 1.7 | 1.0 | 2.1 | 5.2 | region a: region of not less than 20% from core particle side in direction of thickness in alloy plated coating film region b: region of not greater than 80% from surface side of alloy plated coating film in direction of thickness in alloy plated coating film phosphite and 5 wt % of sodium hydroxide was not used as the alloy plating solution for the second reaction, and instead, an alloy plating solution containing 5 wt % of nickel sulfate, 15 wt % of copper sulfate, 5 wt % of sodium hypophosphite and 5 wt % of sodium hydroxide was used.

The conductive fine particles were evaluated in the same manner as in Example 1. The results are shown in Table 1. A uniform and fine alloy plated coating film was densely deposited on these conductive fine particles.

EXAMPLE 3

Conductive fine particles 1 and conductive fine particles 2 were obtained in the same manner as in Example 1, except that an alloy plating solution containing 10 wt % of nickel sulfate, 10 wt % of copper sulfate, 5 wt % of sodium hypophosphite and 5 wt % of sodium hydroxide was not used as the alloy plating solution for the second reaction, and instead, an alloy plating solution containing 15 wt % of nickel sulfate, 5 wt % of copper sulfate, 5 wt % of sodium hypophosphite and 5 wt % of sodium hydroxide was used.

The conductive fine particles were evaluated in the same manner as in Example 1. The results are shown in Table 1. A uniform and fine alloy plated coating film was densely deposited on these conductive fine particles.

COMPARATIVE EXAMPLE 1

Conductive fine particles 1 and conductive fine particles 2 were obtained in the same manner as in Example 1, except It was confirmed from Table 1 that the conductive fine particles of Examples 1, 2 and 3 had different contents of phosphorous in the direction of the thickness in the alloy plated coated film in such a manner that the content of phosphorous was low on the surface side of the alloy plated coating film relative to the core particle side, and in addition, copper was contained on the surface side of the alloy plated coating film. In addition, it was confirmed that the conductive fine particles of Comparative Example 1 did not contain copper.

It can be seen that the conductive fine particles containing copper in the alloy plated coating film had a low resistance value and excellent conductivity.

EXAMPLE 4

The conductive fine particles 2 obtained in Example 1 were added to 100 weight parts of an epoxy resin ("Epicoat 828", made by Yuka Shell Epoxy Co., Ltd.), 2 weight parts of tris(dimethylamino ethyl)phenol and 100 weight parts of toluene, which were resins for a resin binder, and the mixture was sufficiently mixed using a planetary stirring machine, and after that, the mixture was applied to a mold release film so that the thickness after drying became 7 µm, and the toluene was evaporated, and thus, an adhesive film containing the conductive fine particles was obtained. Here, as for the amount of mixture of the conductive fine particles, the content in the film was 50,000/cm$^2$.

After that, the adhesive film containing the conductive fine particles was pasted to an adhesive film, which was obtained without containing conductive fine particles, at room temperature so that an anisotropic conductive film having a two layer structure and a thickness of 17 μm was obtained.

EXAMPLE 5

An anisotropic conductive film was obtained in the same manner as in Example 4, except that the conductive fine particles 2 obtained in Example 2 were added.

EXAMPLE 6

An anisotropic conductive film was obtained in the same manner as in Example 4, except that the conductive fine particles 2 obtained in Example 3 were added.

COMPARATIVE EXAMPLE 2

An anisotropic conductive film was obtained in the same manner as in Example 4, except that the conductive fine particles 2 obtained in Comparative Example 1 were added.

(Evaluation of Conductivity of Anisotropic Conductive Material)

The obtained anisotropic conductive film was cut into a size of 5 mm×5 mm. In addition, two glass substrates, on which an aluminum electrode was formed, having a width of 200 μm, a length of 1 mm, a height of 0.2 μm and an L/S of 20 μm, with a lead line for measuring resistance on one end, were prepared. The anisotropic conductive film was pasted to approximately the center of one glass substrate, and after that, the other glass substrate was positioned so as to overlap the electrode pattern of the glass substrate to which the anisotropic conductive film was pasted, and then, pasted to the other glass substrate.

The two glass substrates were made to adhere to each other through heat and pressure under the conditions with a pressure of 10 N and a temperature of 180° C., and after that, the resistance value between the electrodes was measured. The measurement was carried out on each of the anisotropic conductive films obtained in Examples 4, 5 and 6 as well as Comparative Example 2.

In addition, a PCT test (maintaining for 100 hours under the environment with a high temperature and a high level of moisture of 80° C. and 95% RH) was carried out on the produced test pieces, and after that, the resistance value between the electrodes was measured.

The results of the evaluation are shown in Table 2.

TABLE 2

|  | Resistance value between electrodes (Ω) (normal) | Resistance value between electrodes (Ω) (after PCT test) (after 1000 hours at 80° C. and 95% RH) | Evaluation |
| --- | --- | --- | --- |
| Example 4 | 0.5 | 0.8 | ○ |
| Example 5 | 0.2 | 0.45 | ○ |
| Example 6 | 0.8 | 1.1 | ○ |
| Comparative Example 2 | 2.1 | 5.3 | x |

It can be seen from Table 2 that the anisotropic conductive films using the conductive fine particles obtained in the examples have a low resistance value and excellent conductivity in comparison with the anisotropic conductive film using the conductive fine particles obtained in the comparative example.

INDUSTRIAL APPLICABILITY OF THE INVENTION

The present invention can provide a conductive fine particle having excellent conductivity, furthermore high adhesiveness with a core particle and little cohesion, a method for producing the conductive fine particle where the plating bath is highly stable and an anisotropic conductive material using the conductive fine particle.

Figure 1:
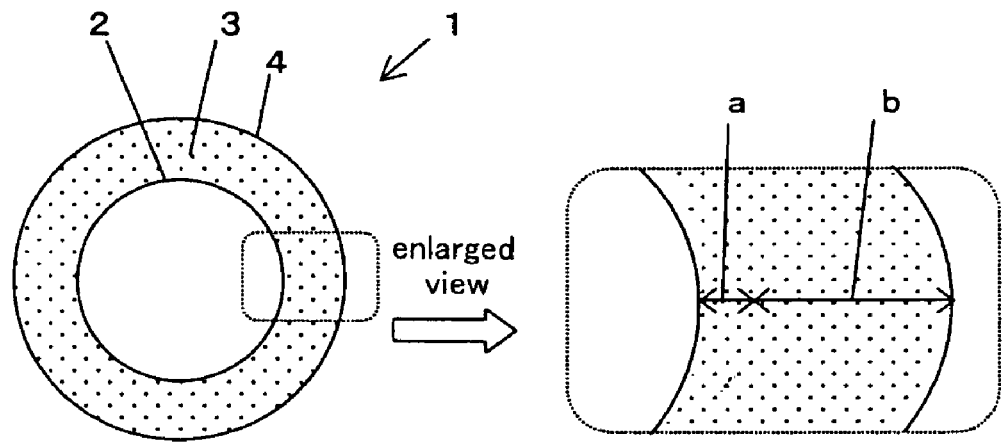
FIG. 1 is a schematic diagram showing a portion where a content of phosphorous in an alloy plated coating film is to be measured in one aspect of the conductive fine particle of the present invention.
Figure 2:
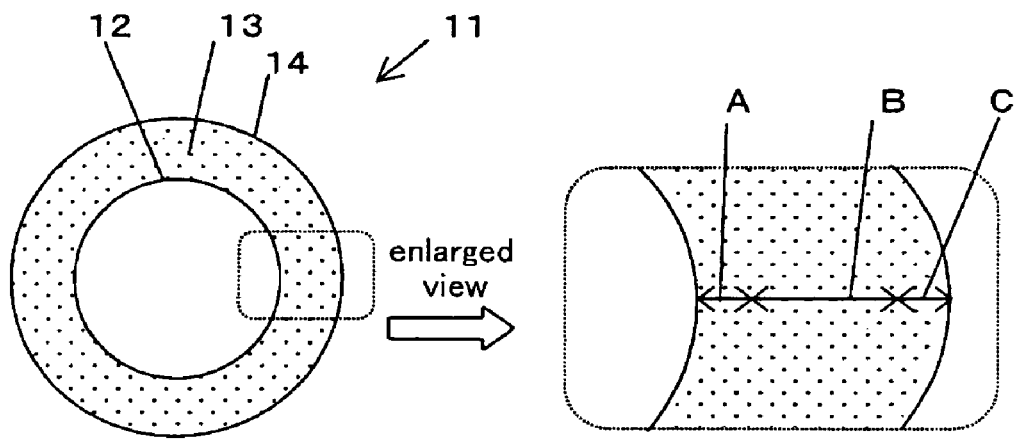
FIG. 2 is a schematic diagram showing a portion where the content of phosphorous in the alloy plated coating film is to be measured in another aspect of the conductive fine particle of the present invention.

EXPLANATION OF REFERENCE 1, 11 conductive fine particle
2, 12 core particle
3, 13 alloy plated coating film
4, 14 surface of alloy plated coating film
a region of not greater than 20% on core particle side in direction of thickness in alloy plated coating film
b region of not greater than 80% on surface side of alloy plated coating film in direction of thickness in alloy plated coating film
A region of not greater than 20% on core particle side in direction of thickness in alloy plated coating film
C region of not greater than 20% on surface side of alloy plated coating film in direction of thickness in alloy plated coating film
B region sandwiched between region A and region C

The invention claimed is:

1. A conductive fine particle,
wherein an alloy plated coating film containing nickel, copper and phosphorous is formed on a surface of a core particle by an electroless plating methods,
wherein the alloy plated coating film contains nickel and phosphorous in a region of not greater than 20% from the core particle side, and contains nickel, copper and phosphorous in a region of not greater than 80% from the surface side of the alloy plated coating film, in the direction of the thickness in the alloy plated coated film, and
wherein the alloy plated coating film contains 8 to 15 wt % of phosphorous in the region of not greater than 20% from the core particle side, and contains 0.05 to 5 wt % of phosphorous in the region of not greater than 80% from the surface side of the alloy plated coating film, in the direction of the thickness in the alloy plated coating film.

2. The conductive fine particle according to claim 1, which contains 0.5 to 90 wt % of copper in the alloy plating composition in the region of not greater than 80% from the surface side of the alloy plated coating film in the direction of the thickness in the alloy plated coating film.

3. The conductive fine particle according to claim 1, which contains 85 to 92 wt % of nickel in the alloy plating composition in the region of not greater than 20% from the core particle side, and contains 5 to 99.45 wt % of nickel in the alloy plating composition in the region of not greater than 80% from the surface side of the alloy plated coating film, in the direction of the thickness in the alloy plated coating film.

4. The conductive fine particle according to claim 1, wherein a gold coating film is further formed on the surface of the alloy plated coating film.

5. A method for producing the conductive fine particle according to claim 1,
wherein a first electroless plating reaction is carried out by adding a plating solution containing a nickel salt, a phosphorous reducing agent and a pH adjustor to an aqueous suspension of the core particles supporting a metal catalyst, and then, a second electroless plating reaction is carried out by adding a plating solution containing the nickel salt, a copper salt, the phosphorous based reducing agent and the pH adjustor.

6. An anisotropic conductive material,
which is obtained by dispersing the conductive fine particle according to claim 1 in a resin binder.

7. The conductive fine particle according to claim 2,
which contains 85 to 92 wt % of nickel in the alloy plating composition in the region of not greater than 20% from the core particle side, and contains 5 to 99.45 wt % of nickel in the alloy plating composition in the region of not greater than 80% from the surface side of the alloy plated coating film, in the direction of the thickness in the alloy plated coating film.

8. The conductive fine particle according to claim 2,
wherein a gold coating film is further formed on the surface of the alloy plated coating film.

9. The conductive fine particle according to claim 3,
wherein a gold coating film is further formed on the surface of the alloy plated coating film.

10. The conductive fine particle according to claim 8,
wherein a gold coating film is further formed on the surface of the alloy plated coating film.

\* \* \* \* \*